(12) United States Patent
Huang et al.

(10) Patent No.: US 9,812,366 B2
(45) Date of Patent: Nov. 7, 2017

(54) METHOD OF TUNING WORK FUNCTION FOR A SEMICONDUCTOR DEVICE

(71) Applicant: Taiwan Semiconductor Manufacturing Company, Ltd., Hsin-Chu (TW)

(72) Inventors: Yu-Lien Huang, Hsinchu County (TW); Tung Ying Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 32 days.

(21) Appl. No.: 14/460,469

(22) Filed: Aug. 15, 2014

(65) Prior Publication Data

US 2016/0049301 A1    Feb. 18, 2016

(51) Int. Cl.
| | |
|---|---|
| H01L 21/8234 | (2006.01) |
| H01L 21/8238 | (2006.01) |
| H01L 21/28 | (2006.01) |
| H01L 29/49 | (2006.01) |
| H01L 29/66 | (2006.01) |

(52) U.S. Cl.
CPC .. *H01L 21/82345* (2013.01); *H01L 21/28088* (2013.01); *H01L 21/823828* (2013.01); *H01L 21/823842* (2013.01); *H01L 29/4966* (2013.01); *H01L 29/66545* (2013.01)

(58) Field of Classification Search
CPC ....... H01L 21/823842; H01L 21/28088; H01L 21/265; H01L 21/28008; H01L 21/266; H01L 21/823828; H01L 21/823431; H01L 21/82345

USPC ................. 438/199, 659, 183, 685
See application file for complete search history.

(56) References Cited

U.S. PATENT DOCUMENTS

| | | | | |
|---|---|---|---|---|
| 9,093,550 | B1* | 7/2015 | Zhao | H01L 21/82 |
| 2006/0208204 | A1* | 9/2006 | Gupta | H01J 37/3171 |
| | | | | 250/492.21 |
| 2010/0255683 | A1* | 10/2010 | Godet | H01J 37/32623 |
| | | | | 438/710 |
| 2013/0037889 | A1* | 2/2013 | Liao | H01L 21/28088 |
| | | | | 257/411 |
| 2015/0170974 | A1* | 6/2015 | Xu | H01L 29/78 |
| | | | | 438/216 |
| 2015/0255557 | A1* | 9/2015 | Zhu | H01L 29/78 |
| | | | | 257/372 |
| 2015/0295067 | A1* | 10/2015 | Xu | H01L 29/49 |
| | | | | 438/299 |

FOREIGN PATENT DOCUMENTS

WO    WO 2014092336 A1 *  6/2014

* cited by examiner

*Primary Examiner* — Shouxiang Hu
(74) *Attorney, Agent, or Firm* — Haynes and Boone, LLP

(57) ABSTRACT

A method of fabricating a semiconductor integrated circuit (IC) is disclosed. The method includes forming pre-tuned-work-function (preTWF) layer over a substrate, applying an angular-doping process to the preTWF layer to change a work function of the preTWF layer (referred to as a tuned work function (TWF) layer). The angular-doping process includes injecting a doping species beam to the preTWF layer with a distribution of injecting angle and forming a metal fill layer over the TWF layer.

13 Claims, 12 Drawing Sheets

METHOD OF TUNING WORK FUNCTION FOR A SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, when a semiconductor device such as metal-oxide-semiconductor field-effect transistors (MOSFETs) is scaled down through various technology nodes, high k dielectric material and metal are adopted to form a gate stack. When forming such a device, the metal layer is tuned to have a proper work function to achieve the designed threshold voltage of the device. Although existing methods of fabricating semiconductor devices have been generally adequate for their intended purposes, they have not been entirely satisfactory in all respects. Therefore, a method is needed for improving the tuning of the work function of the metal layer.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion

DETAILED DESCRIPTION

Figure 1:
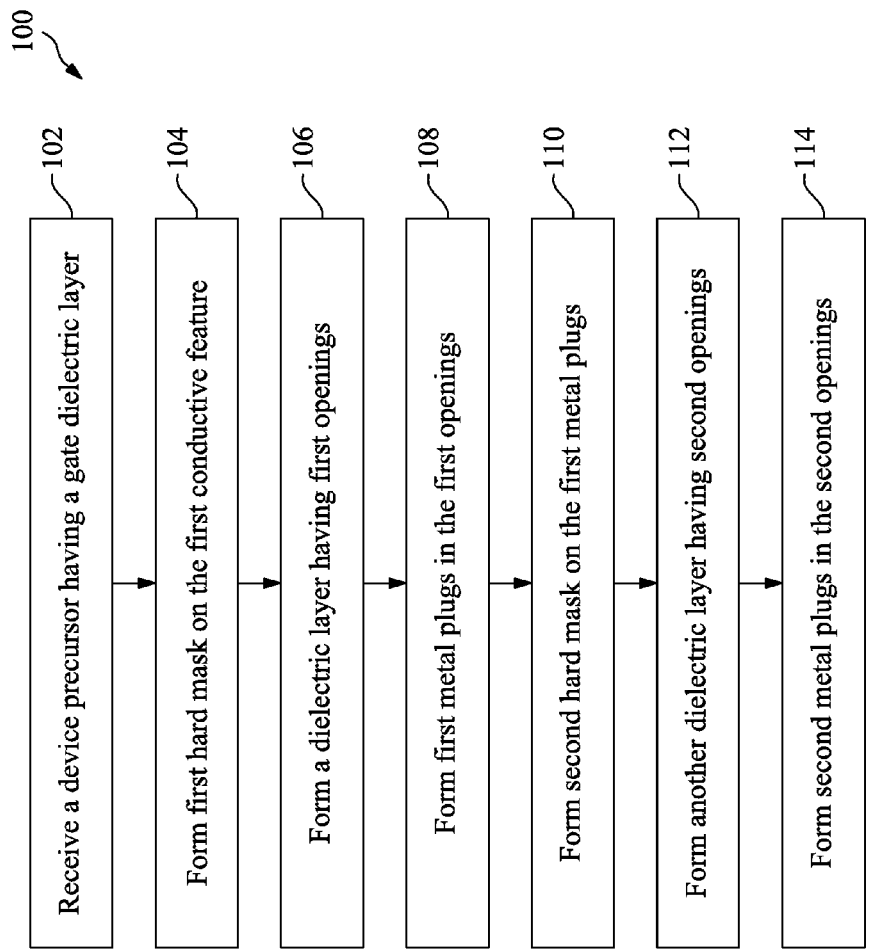
FIG. 1 is a flow chart of an example method for fabricating a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a planar field-effect transistor (FET) and a fin-like field-effect transistor (FinFET) device. The FET device, for example, may be a complementary metal-oxide-semiconductor (CMOS) device including a P-type metal-oxide-semiconductor (PMOS) FET device and an N-type metal-oxide-semiconductor (NMOS) FET device. The following disclosure will continue with a FET example to illustrate various embodiments of the present invention. It is understood, however, that the application should not be limited to a particular type of device.

FIG. 1 is a flowchart of a method 100 for fabricating semiconductor device precursors 200A and 200B, and a semiconductor device 2000 in accordance with some embodiments. It is understood that additional steps may be implemented before, during, and after the method, and some of the steps described may be replaced or eliminated for other embodiments of the method. The semiconductor device precursors 200A and 200B, the semiconductor device 2000 and the method 100 making the same are collectively described with reference to various figures.

Figure 2A:
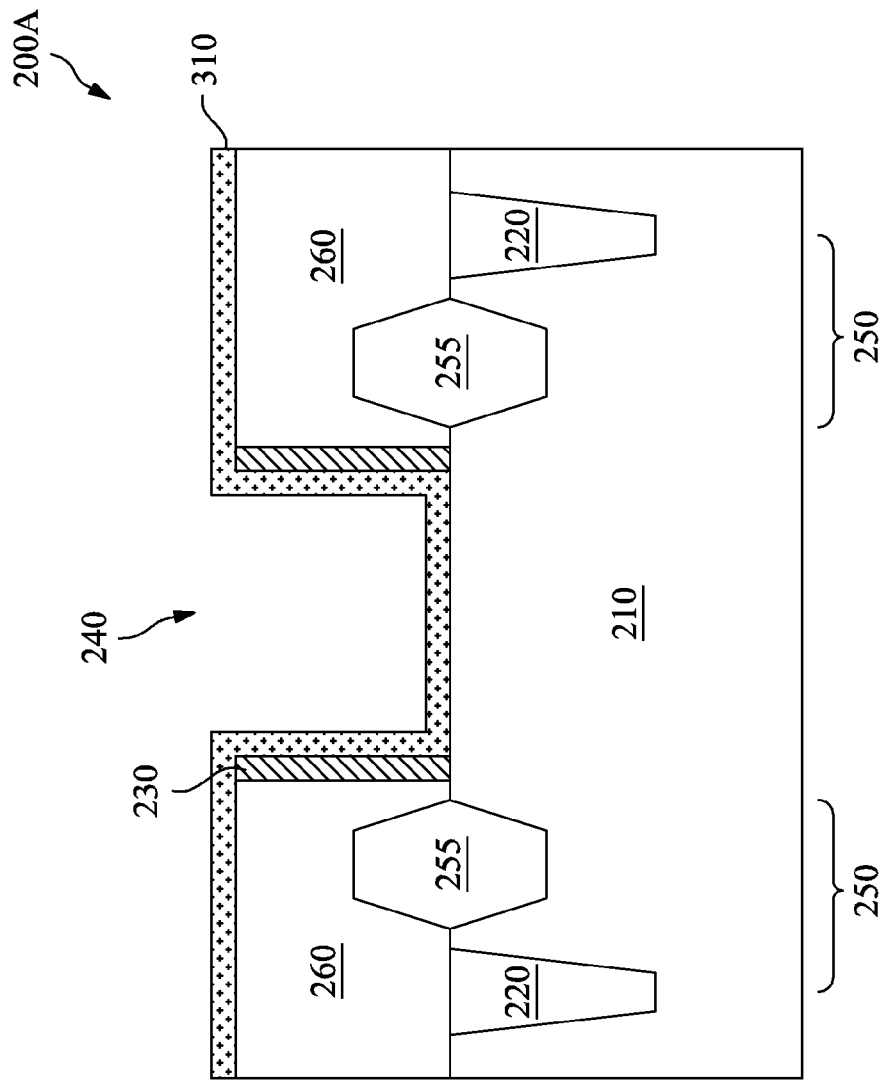
FIG. 2A is a cross-sectional view of an example semiconductor device precursor at fabrication stages constructed according to the method of FIG. 1.

Referring to FIGS. 1 and 2A, the method 100 begins at step 102 by receiving a planar field-effect transistor (FET) precursor 200A. The planar FET precursor 200A includes a substrate 210. The substrate 210 includes silicon. In alternative embodiments, the substrate may include germanium (Ge), silicon germanium (SiGe), gallium arsenide (GaAs) or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The planar FET device precursor 200A may also include a doped region such as a P-well or an N-well, which may be formed by implantation techniques. In the present embodiment, a portion of the substrate 210 is doped P-type to form the P-well, where an n-channel device will be fabricated. The doped region is doped with P-type dopants, such as boron or BF2. The doped region may be formed directly on the substrate 210, in a P-well structure, in an N-well structure, in a dual-well structure, or using a raised structure.

The planar FET device precursor 200A may also include various isolation regions 220. The isolation regions 220 separate various device regions in the substrate 210. The isolation regions 220 include different structures formed by using different processing technologies. For example, the isolation regions 220 may include shallow trench isolation (STI) region. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation regions 220.

The planar FET device precursor 200A may also include spacers 230 and gate trenches 240. In one example, the spacers 230 are formed by forming a dummy gate stack over the substrate 210 first, then forming spacers 230 along sidewall of the dummy gate stack. The spacers 230 may include a dielectric material such as silicon oxide. Alternatively, the spacers 230 may include silicon nitride, silicon carbide, silicon oxynitride, or combinations thereof. The spacers 230 may be formed by deposition and dry etching processes known in the art. Thereafter, the dummy gate stack is removed to form the gate trench 240. The dummy gate stacks may be removed by lithography patterning and etch processes. Alternatively, the dummy gate stacks may be removed by a selective wet etch or a selective dry etch, or a combination of dry and wet etch.

The planar FET device precursor 200A may also include source/drain (S/D) regions 250 in the substrate 210, separated by the gate trench 240. The S/D regions 250 are formed by a proper technique, such as one or more ion implantations. The S/D regions 250 may further include lightly doped (LDD) and heavily doped regions. After the formation of the source and drain (S/D) regions 250, one or more annealing processes may be performed. The annealing processes may include rapid thermal anneal (RTA), laser anneal, or other suitable annealing processes. As an example, a high-temperature thermal anneal step that may apply temperatures anywhere in the range of 900 C-1100 C, though other embodiments may use temperatures within a different range. As another example, high-temperature anneal includes a "spike" annealing process that has a very short time duration.

In one embodiment, for a gate last process flow, prior to removing the dummy gate stack, S/D features 255 may be formed in the S/D regions 250. For example, a portion of the semiconductor substrate 210 in the S/D region 250 is recessed first to form S/D recessing trenches and a semiconductor material layer epitaxially grows in the S/D recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features 255 may be formed by one or more epitaxy or epitaxial (epi) processes. The S/D features 255 may be in-situ doped during the epitaxy process. In one embodiment, the source/drain features are not in-situ doped, an implantation process (i.e., a junction implant process) is performed to dope the S/D features. One or more annealing processes may be performed to activate source/drain epitaxial feature. The annealing processes comprise rapid thermal annealing (RTA) and/or laser annealing processes.

The planar FET device precursor 200A may also include an interlayer dielectric (ILD) layer 260 on the substrate 210. The ILD layer 260 includes silicon oxide, oxynitride or other suitable materials. The ILD layer 260 includes a single layer or multiple layers. The ILD layer 260 is formed by a suitable technique, such as CVD, ALD and spin-on (SOG). The ILD layer 260 fills in gaps between the dummy gate stacks prior to forming the gate trench 240. A CMP process may be performed to remove the excess ILD layer 260.

In the present embodiment, the planar FET device precursor 200A includes a gate dielectric layer 310 disposed in the gate trench 240. The gate dielectric layer 310 may include an interfacial layer (IL) deposited by any appropriate method, such as ALD, CVD and ozone oxidation. The IL includes oxide, HfSiO and oxynitride. The gate dielectric layer 410 may also include a high-k (HK) dielectric layer deposited on the IL by suitable techniques, such as ALD, CVD, metalorganic CVD (MOCVD), physical vapor deposition (PVD), thermal oxidation, combinations thereof, or other suitable techniques. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 2B:
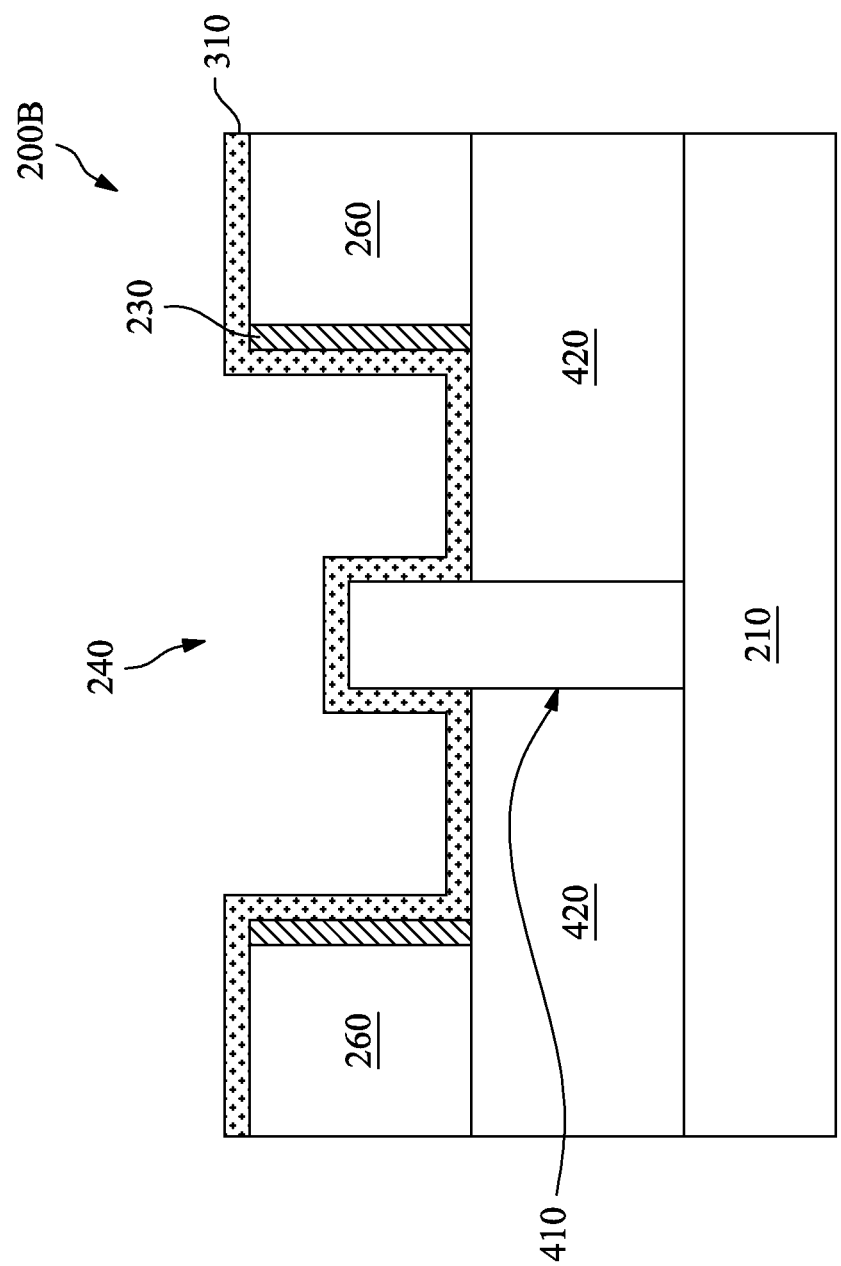
FIG. 2B is a cross-sectional view of another example semiconductor device precursor at fabrication stages constructed according to the method of FIG. 1.

FIG. 2B disclosed another embodiment having a fin-like field-effect transistor (FinFET) precursor 200B. The FinFET precursor 200B includes fin features 410 disposed over the substrate 210. The fin features 410 are formed by any suitable process including photolithography and etching processes. For example, a fin material layer is formed over the substrate 210. The fin material layer may include SiGe, Si, GaAs, silicon SiGe, AlGaAs, GaAsP, or other suitable materials. The fin material layer may include multiple layers. The fin material layer may be deposited by epitaxial growth. In various examples, the epitaxial processes include CVD, molecular beam epitaxy, and/or other suitable processes. A patterned hard mask is then formed over the fin material layer and the fin material layer is then etched through the patterned hard mask to form the fin features 410.

The etching process may include a wet etch or a dry etch. In one embodiment, the wet etching solution includes a tetramethylammonium hydroxide (TMAH), a $HF/HNO_3/CH_3COOH$ solution, $NH_4OH$, KOH (potassium hydroxide), HF (hydrofluoric acid), or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching). Alternatively, the first features 410 are formed by etching the substrate 210 through a patterned hard mask. The fin feature 410 may also be formed in various shapes, such as a rectangular shape, Ω-shape (for an all-around-gate device), and/or other suitable shapes.

The FinFET precursor 200B may also include a dielectric layer 420 disposed between spaces between each of fin feature 410. In one example, dielectric layer 420 forms a shallow trench isolation structure. Dielectric layer 420 may include silicon oxide, silicon oxynitride, silicon nitride, silicon carbide, silicon carbide nitride, low k dielectric material or other suitable dielectric materials. The dielectric layer 420 is deposited over the substrate 210 by a suitable technique, such as CVD, ALD and spin-on (SOG), and it is then recessed to expose an upper portion of fin features 410.

The FinFET precursor 200B may also include spacers 230, the gate trench 240 and the ILD layer 260, which are formed similarly in many respects to those discussed above in association with FIG. 2A.

In the present embodiment, the FinFET precursor 200B includes the gate dielectric layer 310 disposed in the gate trench 240, including wrapping over the upper portion of the fin feature 410. In one embodiment, the gate dielectric layer 310 wraps over the Ω-shape fin feature 410 and it is referred as an all-around gate structure. The gate dielectric layer 310 is formed similarly in many respects to those discussed above in association with FIG. 2A.

The following description will be directed to the embodiment of FIG. 2A, for the sake of example. It is understood that similar steps can be implemented on the embodiment of FIG. 2B.

Figure 3:
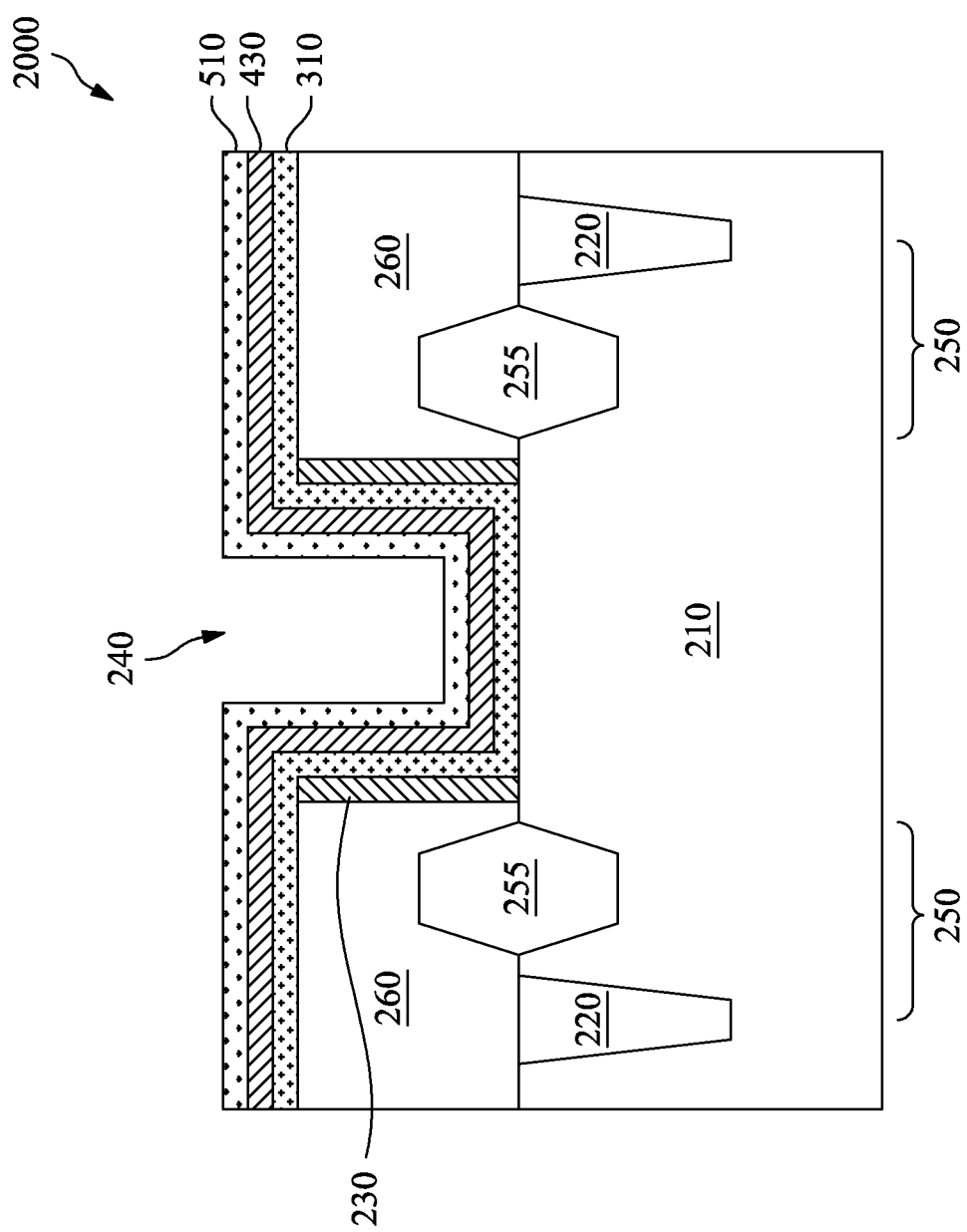
FIGS. 3 and 4A-4B are cross-sectional views of an example semiconductor device at fabrication stages constructed according to the method of FIG. 1.

Referring to FIGS. 1 and 3, once the planar FET device precursor 200A is received, the method 100 proceeds to step 104 by depositing a barrier layer 430 over the gate dielectric layer 310. The barrier layers 430 conducts electricity and prevents inter-diffusion and reaction between metals, silicon or dielectric materials. The candidates for the barrier material may include refractory metals and their nitrides (e.g. TiN, TaN, $W_2N$, TiSiN, TaSiN). The barrier layer 430 may be deposited by PVD, CVD, Metalorganic CVD (MOCVD) and ALD.

Referring also to FIGS. 1 and 3, the method 100 proceeds to step 106 by depositing pre-tuned-work-function (preTWF) layer 510 over the barrier layer 430. The preTWF layer 510 is a metal layer, which may include Ti, Ag, Al, TiAlN, TaC, TaCN, TaSiN, Mn, Zr, TiN, TaN, Ru, Mo, WN, and/or combinations thereof. The preTWF layer 510 may be deposited by PVD, CVD, ALD, and/or other suitable techniques. In one embodiment, the preTWF layer 510 is formed by multiple layers. The preTWF 510 may be formed with different profiles in different portions of it. For example, at the bottom of the gate trench 240, the preTWF layer 510 has a flat horizontal profile and along the sidewall of the gate trench, the preTWF layer 510 has a vertical profile.

In the present embodiment, a material of the preTWF layer 510 may be chosen by considerations of process feasibility and/or other process integration advantage. However, the work function of a chosen preTWF layer 510 may not satisfy the intended design requirements of the semiconductor device being manufactured. For example, one may select a material for preTWF layer 510 having a work function that is either higher or lower than the targeted work function for the completer semiconductor device.

Also, it is often desirable to be able to make a semiconductor device with different threshold voltages (Vt) such that one can then mix low-power devices (high $V_{th}$, low off-state, or leakage current ("$I_{off}$"), but slow devices of low on-state, or drain current ("$I_{on}$") with high-speed devices (low $V_{th}$, high Ion, but energy-hungry devices of high $I_{off}$). Therefore, the semiconductor device 2000 may need different WF layers with different work function. To tune the preTWF layer 510 to have a targeted work-function, or having different work-functions, the method 100 provides a work-function tuning process to meet those needs as described below.

Figure 4A:
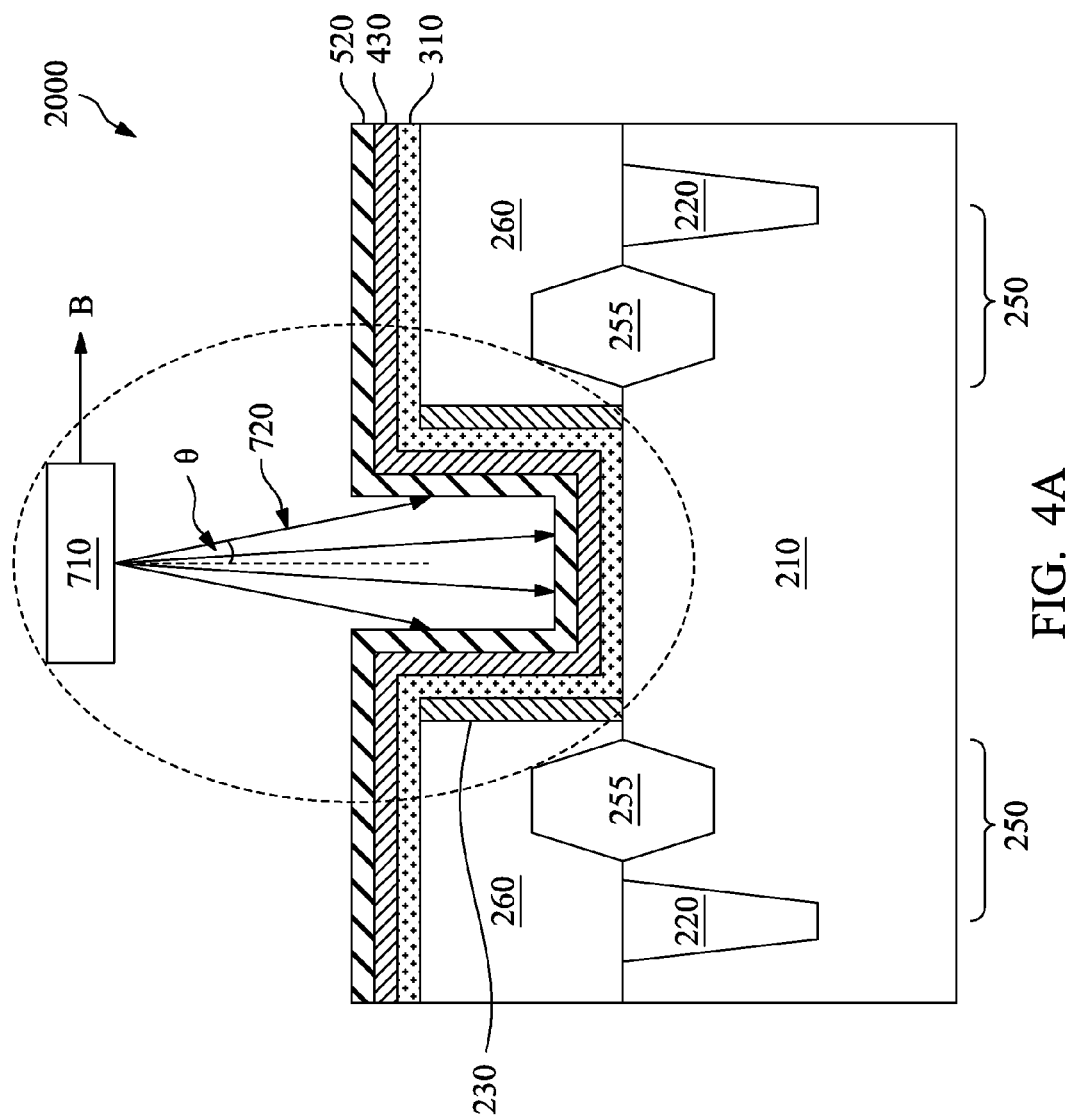
Figure 4B:
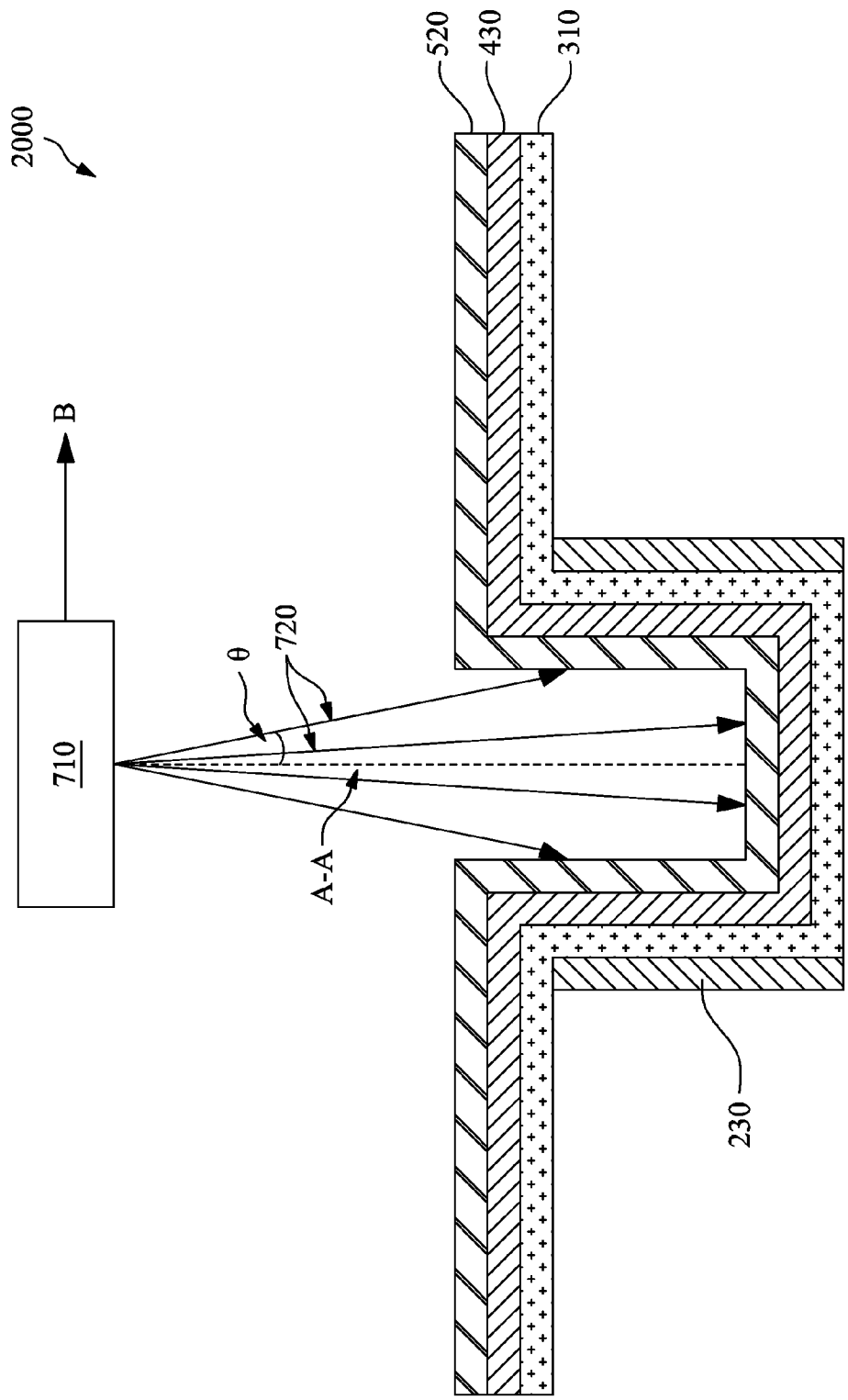

Referring to FIGS. 1 and 4A-4B, the method 100 proceeds to step 108 by applying a multiple-angle-doping (MAD) process to covert the preTWF layer 510 to a tuned WF (TWF) layer 520, which has the targeted work function. The MAD process includes doping species such as phosphorus, arsenic, boron, $BF_2$, indium, and/or any suitable species. The MAD process includes plasma doping process, ion implanting, and/or other doping process. The MAD process injects a group of doping species beams 720 from a doping species source 710 to the preTWF layer 510. The doping species source 710 moves in a predetermined B direction with respect to the FinFET device 2000. In one embodiment, the B direction is parallel to the substrate 210. An injecting angle θ is defined as an angle between a middle species beam 720 and a direction A-A of an assigned surface 730 of the preTWF layer 510, such as the surface of the preTWF layer 510 at bottom of the gate trench 240.

Figure 4C:
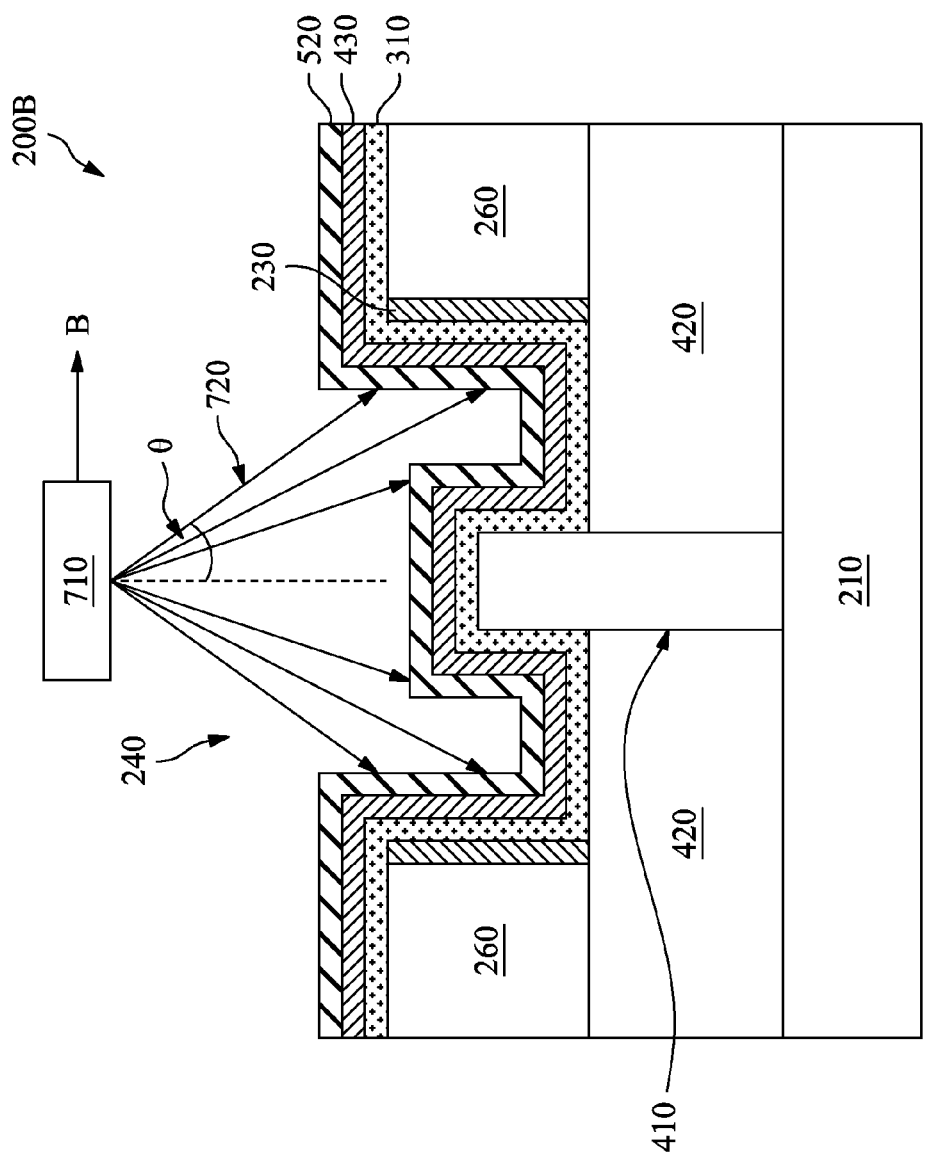
FIG. 4C is a cross-sectional view of another example semiconductor device at fabrication stages constructed according to the method of FIG. 1.
Figure 5A:
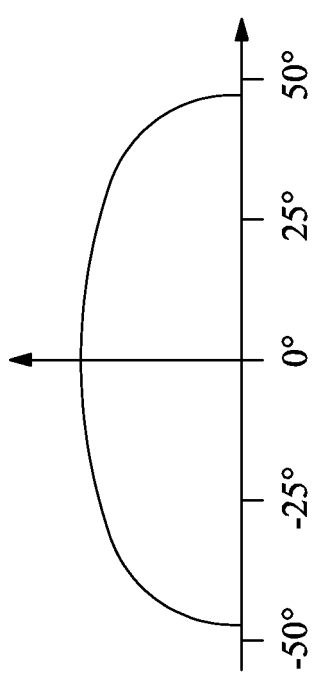
FIGS. 5A and 5B are diagrammatic views of the injecting angle distribution associated with the method of FIG. 1.
Figure 5B:
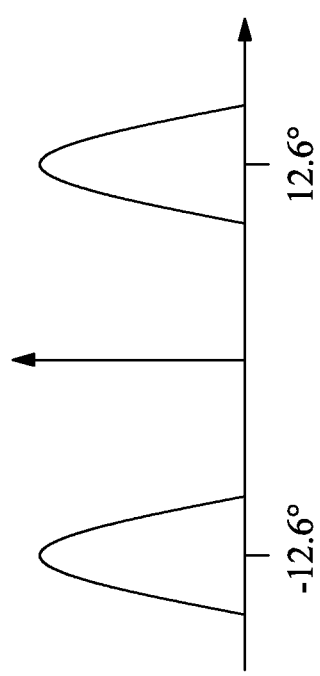

The semiconductor device 2000 is further illustrated in FIG. 4B, in a sectional fragmental view. Particularly, a portion of the semiconductor device 2000 is zoomed in for clarity. In the present embodiment, the injecting angle θ is not a mono angle and is a distribution of injecting angles (DIA). In one embodiment, the DIA is a continuous probability distribution that having injecting angle θ from −A degree to +A degree with respect to a center where θ is equal to zero, here the symbol "−" and the symbol "+" represent two opposite directions with respect to the center. As an example, the DIA is a band-shape distribution with a range from −50 degree to +50 degree, as shown in FIG. 5A. In another embodiment, the DIA is a bi-modal distribution, that the probability of injecting angle θ has two distinct peaks at two respective injecting angles θ. As an example, the bi-modal DIA has two distinct peaks at −/+12.6 degree, as shown in FIG. 5B. FIGS. 5A and 5B graphically illustrate two examples of injecting angle distribution, which have the doping intensity (vertical scale) vs. the injecting angle (horizontal scale). By adjusting doping species, doping species concentration, DIA and doping energy, the work-function of the preTWF layer 510 is adjusted respectively. In the present embodiment, by using MAD process, work-function of the preTWF layer 510 can be tuned uniformly. Additionally, the MAD process may be applied multiple times with different DIAs to optimize work function uniformity of the TWF layer 520. As a result, the TWF layer 520 with a uniform work function is formed in the gate trench 240, as shown in FIG. 4A. Also, the TWF layer 520 with a uniform work function is wrapping over the fin feature 410, as shown in FIG. 4C.

Figure 6A:
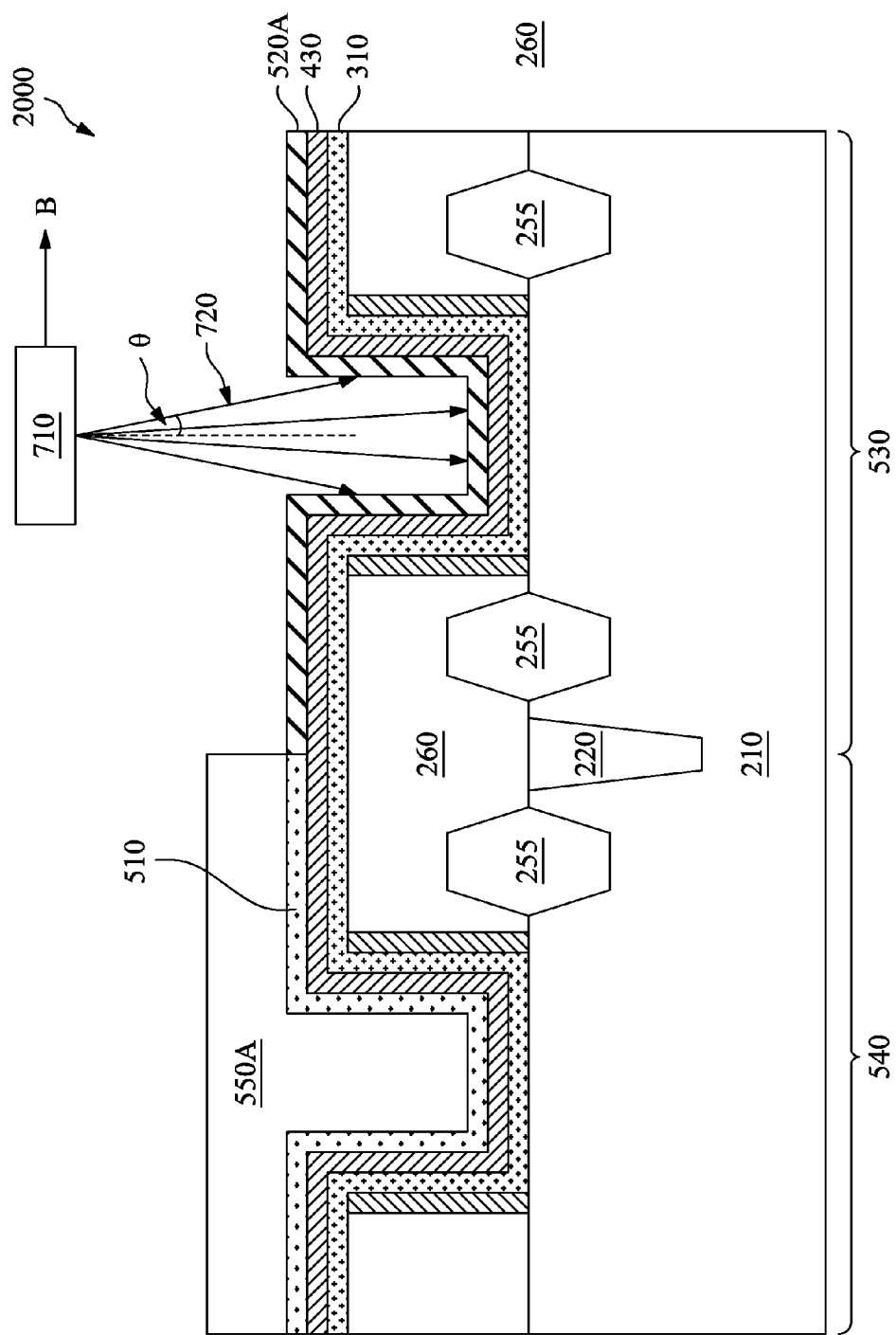
FIGS. 6A and 6B are cross-sectional views of an example semiconductor device at fabrication stages constructed according to the method of FIG. 1.
Figure 6B:
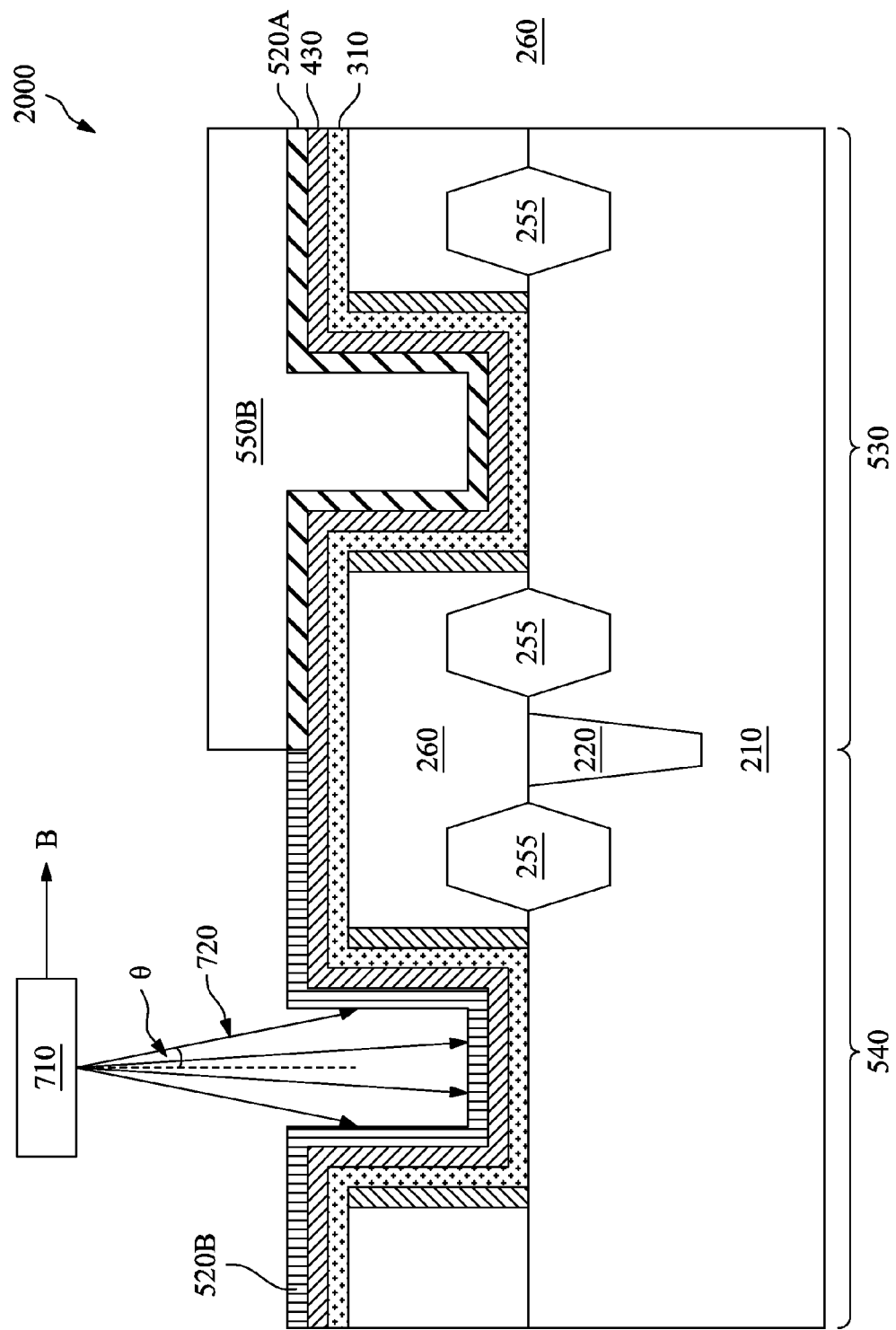

Referring to FIGS. 6A and 6B, the semiconductor device 2000 may have a first region 530 and a second region 540. Different work functions are needed in the first region 530 from a work function in the second region 540. For example, an N-type work function is needed in the first region while a p-type work function is needed in the second region. A first MAD process is applied to the preTWF layer 510 in the first region 530 to tune it to a first TWF 520A while it is covered in the second region 540 by a patterned hard mask 550A. The patterned hard mask 550A may include a patterned photoresist layer and it is removed after the first MAD process. Then a second MAD process is applied to the preTWF layer 510 in the second region to tune it to a second TWF layer 520B while the first region 530 is covered by another patterned hard mask 550B. The hard mask 550B is then removed after the second MAD process. Therefore, both of first and second TWF layer, 520A and 520B, are formed by applying different MAD process to a same preTWF layer 510. Thus the first and second TWF layer, 520A and 520B share a common composition. As an example, for an n-type work function, the Ti preTWF layer 510 receives an arsenic (As) MAD process with As concentration of about $2\times10^{16}/cm^3$, doping energy of 3 KeV and bi-model distribution of +/−20 degree. For another example, for a p-type work function, the Ti preTWF layer 510 receives a boron (B) MAD process with B concentration of about $1.5\times10^{16}/cm^3$, doping energy of 5 KeV and bi-model distribution of +/−20 degree.

After applying the MAD process, an annealing process may be applied to the TWF layer 520 for dopant activation and diffusion. The annealing process may be a rapid thermal anneal (RTA), a laser anneal, a millisecond anneal, a microwave anneal, and/or a flash lamp anneal. In the present embodiment, a low-thermal-budget annealing process is conducted with a temperature less than 500° C.

Figure 7A:
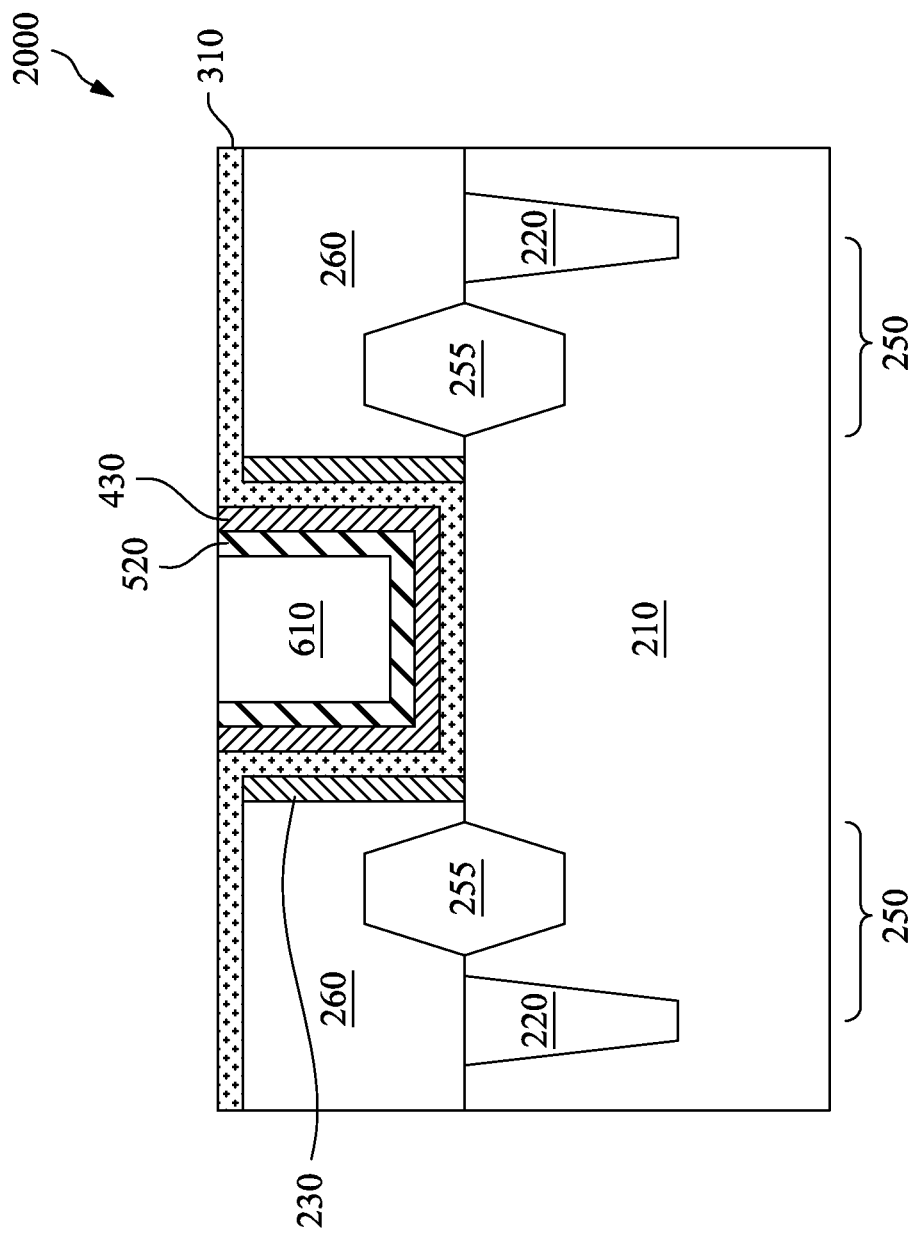
FIG. 7A is a cross-sectional view of an example semiconductor device at fabrication stages constructed according to the method of FIG. 1.
Figure 7B:
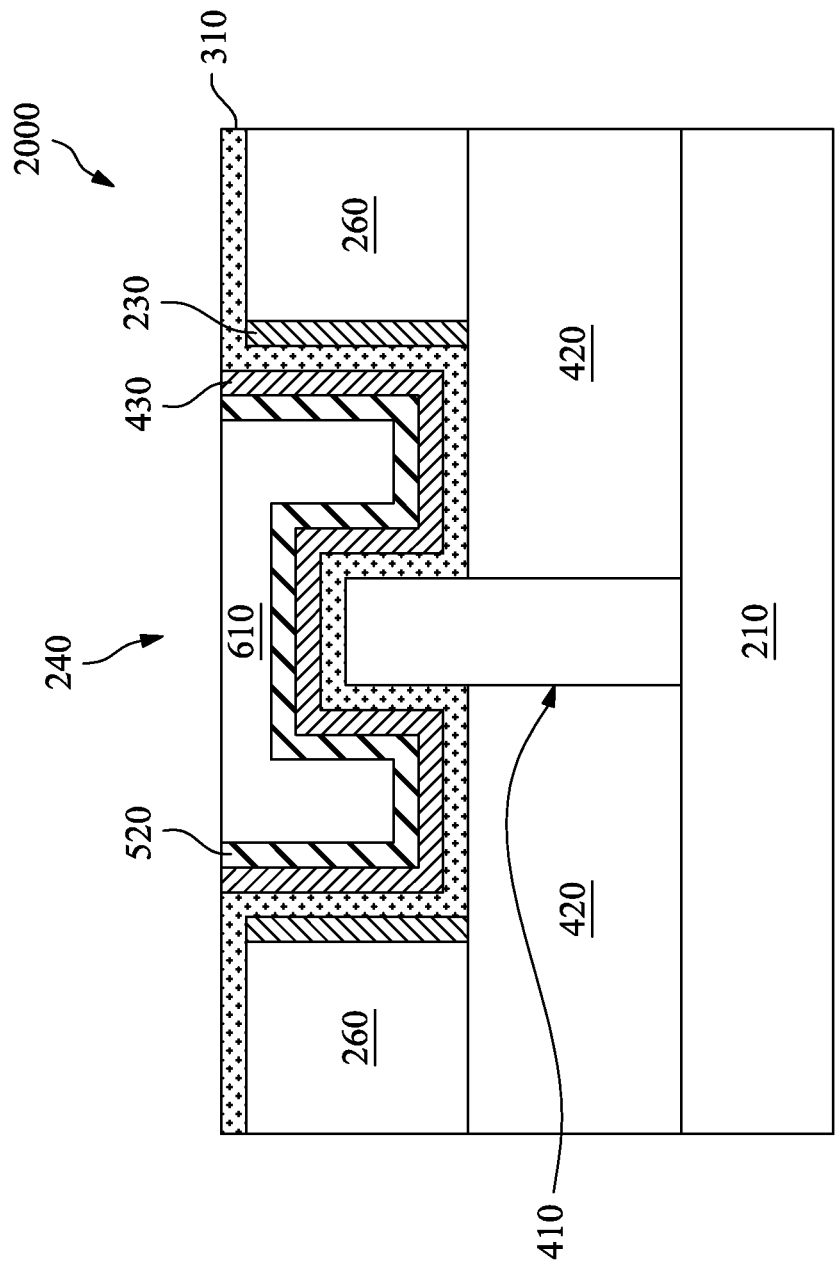
FIG. 7B is a cross-sectional view of another example semiconductor device at fabrication stages constructed according to the method of FIG. 1.

Referring to FIGS. 1 and 7A-7B, the method 100 proceeds to step 108 by depositing a metal fill layer 610 over the TWF layer 520 and filling the gate trench 240. The metal fill layer 610 may include aluminum (Al), tungsten (W), or copper (Cu) and/or other suitable materials. The metal fill layer 610 may be formed by CVD, PVD, plating, and/or other suitable processes. A CMP may be performed to remove excessive metal fill layer 610, the TWF layer 520 and the barrier layer 420.

Additional steps can be provided before, during, and after the method 100, and some of the steps described can be replaced, eliminated, or moved around for additional embodiments of the method 100. For example, a multiple angular-doping process may be performed employing with respective patterned hard masks to form the FWF layer 520 with different work functions over different portion of the semiconductor device 2000.

The semiconductor device 2000 may include additional features, which may be formed by subsequent processing. For example, various contacts/vias/lines and multilayer interconnect features (e.g., metal layers and interlayer dielectrics) may be formed over the substrate, configured to connect the various features or structures of the semiconductor device 2000. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, it can be seen that the present disclosure offers methods for fabricating a semiconductor device. The method employs a multi-angle-doping (MAD) process, with an injecting angle distribution (DIA), for work function tuning. The method provides a uniform work function on different portions of a work function layer which has a non-flat profile. The method also includes forming different work function by tuning a same pre-tuning-work-function layer. The method provides quite simple and flexible processes for forming/tuning work function to meet request of semiconductor device performance.

The present disclosure provides many different embodiments of fabricating a semiconductor device that provide one or more improvements over existing approaches. In one embodiment, a method for fabricating a semiconductor device includes forming a pre-tuned-work-function (preTWF) layer over a substrate, applying an angular-doping process to the preTWF layer to change a work function of the preTWF layer (referred to as a tuned work function (TWF) layer). The angular-doping process including injecting a doping species beam to the preTWF layer with a distribution of injecting angle and forming a metal fill layer over the TWF layer.

In another embodiment, a method for fabricating a semiconductor IC includes receiving a semiconductor device precursor. The semiconductor device precursor includes forming a gate dielectric layer over a substrate, forming a barrier layer over the gate dielectric layer, forming a pre-tuned-work-function (preTWF) layer over the barrier layer, applying an angular-doping process to the preTWF layer to change a work function of the preTWF layer (which become a tuned work function (TWF) layer). The angular-doping process includes injecting doping species beams to the preTWF layer with a distribution of injecting angle and forming a metal fill layer over the TWF layer In yet another embodiment, a method for fabricating a semiconductor IC includes receiving a semiconductor device precursor. The semiconductor device precursor includes forming a high-k (HK) dielectric layer over a fin feature in a substrate, forming a barrier layer over the HK layer, forming a pre-tuned-work-function (preTWF) layer over the barrier layer, applying an angular-doping process to the preTWF layer to change a work function of the preTWF layer (which become a tuned work function (TWF) layer). The angular-doping process includes injecting doping species beams to the preTWF layer with a distribution of injecting angle, wherein the distribution of the injecting angle including one of two models, one is a band type and one is a bi-modal type, applying an annealing process to the TWF, which has a temperature range less than 500° C. The method also includes forming a metal fill layer over the TWF layer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for fabricating a semiconductor device, the method comprising:
   forming a metal layer over a substrate;
   determining a first distribution of injecting angles (DIA) for tuning a work function of the metal layer, wherein the first DIA is one of a band-type continuous probability distribution having a range from a first angle to a second angle and a multimodal probability distribu- tion having at least a first peak at a third angle and a second peak at a fourth angle;

modifying the work function of the metal layer by applying a first multi-angle-doping (MAD) process to a first region of the metal layer, the first region defining a first work function, according to the first DIA that includes:
  injecting, from an emission point of a doping species source, a first plurality of doping species beams towards the metal layer while the substrate remains at a first orientation, wherein a first plurality of injecting angles of the first plurality of doping species beams are in accordance with the first DIA;

determining a second DIA for tuning the work function of the metal layer, wherein the second DIA is the other of the band-type continuous probability distribution and the multimodal probability distribution; and after applying the first MAD process, applying a second MAD process to the first region of the metal layer according to the second DIA, wherein the second MAD process includes:
  injecting, from the emission point of the doping species source, a second plurality of doping species beams towards the metal layer while the substrate remains at the first orientation, wherein a second plurality of injecting angles of the second plurality of doping species beams are in accordance with the second DIA.

2. The method of claim 1, further comprising:
prior to forming the metal layer over the substrate, forming a high-K (HK) dielectric layer over the substrate; and
forming a barrier layer over the HK dielectric layer.

3. The method of claim 1, further comprising:
forming a filling metal layer over the metal layer after the applying the first MAD process.

4. The method of claim 1, wherein the first DIA is the band-type continuous probability distribution, and wherein the first angle and the second angle have a first absolute value.

5. The method of claim 4, wherein the second DIA is a bi-modal probability distribution, wherein the third angle and the fourth angle have a second absolute value less than the first absolute value.

6. The method of claim 1, further comprising:
after applying the second MAD process, applying an annealing process to the metal layer, wherein a low-thermal budget annealing process is applied, with a temperature range less than 500° C.

7. The method of claim 1, wherein the first and second MAD processes are applied to the metal layer in the first region while covering the metal layer in a second region with a first hard mask; and
wherein a third MAD process is applied to the metal layer in the second region while covering the metal layer in the first region with a second hard mask.

8. The method of claim 7, wherein after applying the first and second MAD processes, the metal layer in the first region has an N-type work function, and
wherein after applying the third MAD process, the metal layer in the second region has a P-type work function.

9. The method of claim 7, wherein the forming the metal layer includes:
forming the metal layer having a same composition in the first region and the second region.

10. A method for fabricating a fin-like field-effect transistor (FinFET) device, the method comprising:
forming a high-k (HK) dielectric layer over a fin feature in a substrate;
forming a barrier layer over the HK layer;
forming a pre-tuned-work-function (preTWF) layer over the barrier layer;
determining a first distribution of injecting angles (DIA) and a second DIA different from the first DIA for changing a work function of the preTWF layer, wherein the first DIA and the second DIA are different ones of a band-type continuous probability distribution having a range from a first angle to a second angle and a multimodal probability distribution having at least a first peak at a third angle and a second peak at a fourth angle;
modifying the work function of the preTWF layer to generate a tuned work function (TWF) layer by operations including:
  injecting a first plurality of doping species beams to a first region of the preTWF layer while the substrate remains at a first orientation, a first plurality of injecting angles of the first plurality of doping species beams being in accordance with the first DIA, the first region defining a first work function; and
  injecting a second plurality of doping species beams to the first region of the preTWF layer while the substrate remains at the first orientation, a second plurality of injecting angles of the second plurality of doping species beams being in accordance with the second DIA; and
forming a metal fill layer over the TWF layer.

11. The method of claim 10, wherein the first DIA is the band-type continuous probability distribution.

12. The method of claim 10, wherein the first DIA is a bi-modal probability distribution.

13. The method of claim 10, further comprising:
applying an annealing process to the TWF layer, wherein a low-thermal budget annealing process is applied, with a temperature range less than 500° C.

* * * * *